US012581910B2

(12) United States Patent
Choi et al.

(10) Patent No.: US 12,581,910 B2
(45) Date of Patent: Mar. 17, 2026

(54) SUBSTRATE PROCESSING APPARATUS

(71) Applicant: WONIK IPS CO., LTD., Pyeongtaek-si (KR)

(72) Inventors: Kwang Ha Choi, Sejong-si (KR); Tae Ho Ham, Hwaseong-si (KR); Cheol Woo Lee, Hwaseong-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 350 days.

(21) Appl. No.: 17/991,547

(22) Filed: Nov. 21, 2022

(65) Prior Publication Data

US 2023/0170247 A1     Jun. 1, 2023

(30) Foreign Application Priority Data

Nov. 29, 2021     (KR) ........................ 10-2021-0167419

(51) Int. Cl.
*H01L 21/687* (2006.01)
*H01L 21/67* (2006.01)
*H01L 21/677* (2006.01)

(52) U.S. Cl.
CPC .. *H01L 21/68764* (2013.01); *H01L 21/67196* (2013.01); *H01L 21/67207* (2013.01); *H01L 21/67757* (2013.01)

(58) Field of Classification Search
CPC ......... H01L 21/68771; H01L 21/68764; H01L 21/67748; H01L 21/67757; H01L 21/67742; H01L 21/67196; H01L 21/6719; H01L 21/677; H01L 21/67207; H01L 21/68785; H01L 21/67718; H01L 21/67796; H01L 21/67745
See application file for complete search history.

(56) References Cited

U.S. PATENT DOCUMENTS 5,855,465 A      1/1999  Boitnott et al.
6,143,082 A  *  11/2000  McInerney ....... C23C 16/45519
                                                                  118/730

(Continued)

FOREIGN PATENT DOCUMENTS

JP          H11163075 A       6/1999
JP          2007049150 A      2/2007
(Continued)

*Primary Examiner* — Glenn F Myers
(74) *Attorney, Agent, or Firm* — WILLIAM PARK AND ASSOCIATES LTD.

(57) ABSTRACT
Provided is a substrate processing apparatus, and more particularly, to a substrate processing apparatus that performs substrate processing on a plurality of substrates in a process chamber defining a plurality of processing spaces. The substrate processing apparatus includes a process chamber in which N processing spaces are defined to process substrates, N gas injection units installed above the process chamber to respectively correspond to the N processing spaces, N substrate supports that face the gas injection units and support the substrates, a transfer support installed in the process chamber to support the substrates, a rotation support which is installed between the adjacent substrate supports that are substrate transfer paths according to rotation driving of the transfer support and on which the substrates are seated to be rotated about a vertical second rotation axis passing through the substrates.

18 Claims, 8 Drawing Sheets

(56)     References Cited

U.S. PATENT DOCUMENTS

| | | | |
|---|---|---|---|
| 6,319,553 B1 | 11/2001 | McInerney et al. | |
| 7,241,203 B1 | 7/2007 | Chen et al. | |
| 10,109,517 B1 * | 10/2018 | Blank | H01L 21/68 |
| 2007/0034479 A1 * | 2/2007 | Todaka | H01L 21/6719 |
| | | | 414/941 |
| 2018/0211864 A1 * | 7/2018 | Nordin | H01L 21/67196 |
| 2021/0013055 A1 | 1/2021 | Schaller et al. | |
| 2022/0172967 A1 * | 6/2022 | Topping | H01L 21/68764 |

FOREIGN PATENT DOCUMENTS

| | | | | |
|---|---|---|---|---|
| KR | 1020190074481 A | 6/2019 | | |
| KR | 102150230 B1 * | 8/2020 | ....... | H01L 21/67167 |
| WO | 2021011229 A1 | 1/2021 | | |
| WO | 2021026430 A1 | 2/2021 | | |

* cited by examiner

SUBSTRATE PROCESSING APPARATUS

CROSS-REFERENCE TO RELATED APPLICATIONS

This U.S. non-provisional patent application claims priority under 35 U.S.C. § 119(a) to Korean Patent Application No. 10-2021-0167419, filed on Nov. 29, 2021, in the Korean Intellectual Property Office, the entire contents of which are hereby incorporated by reference.

FIELD OF THE INVENTION

The present invention disclosed herein relates to a substrate processing apparatus, and more particularly, to a substrate processing apparatus that performs substrate processing on a plurality of substrates in a process chamber defining a plurality of processing spaces.

BACKGROUND ART

In a typical substrate processing apparatus, there is a case in which substrate processing is performed on a plurality of substrates in one process chamber for various purposes such as productivity and process uniformity.

For this, the typical substrate processing apparatus may include a process chamber, in which a plurality of processing spaces are defined, and substrate processing is performed, a plurality of gas injection units installed above the process chamber to inject a process gas into the processing spaces, and a plurality of substrate supports installed in the process chamber to correspond to the plurality of gas injection units so as to support a substrate.

Here, the plurality of loaded substrates are respectively disposed in the processing spaces through a transfer support so that the substrates are processed, and when the substrates are completely processed, the processed substrates are unloaded to the outside of the process chamber.

There is a limitation in that distribution of a thickness of a thin film of each of the substrates is non-uniform due to a variation in an amount of gas injected through the gas injection units according to positions of the substrates in the substrate processing process.

To improve the non-uniformity, it is necessary to allow the substrate to rotate about a vertical rotation axis. However, the typical substrate processing apparatus, there is a limitation in that the substrate is only transferred from one substrate support to the other substrate support, but there is no means capable of rotating the substrate itself.

In addition, even if it is intended to separately add a configuration for rotating the substrate itself, there is a limitation in that it is difficult to add a plurality of configurations for rotating each of the plurality of substrates in the limited internal space of the process chamber.

SUMMARY OF THE INVENTION

To solve the above-mentioned limitations, the present invention provides a substrate processing apparatus, in which a substrate itself is rotatable about a vertical rotation axis in the substrate processing apparatus, in which a plurality of processing space are defined to performs substrate processing on a plurality of substrates.

An embodiment of the present invention provides a substrate processing apparatus including: a process chamber (100) in which N processing spaces (S) (N is a natural number equal to or greater than 2) are defined to process substrates (1); N gas injection units (200) installed above the process chamber (100) to respectively correspond to the N processing spaces (S) so as to inject a gas into each of the processing spaces (S); N substrate supports (300) that face the gas injection units (200) and support the substrates (1); a transfer support (400) installed in the process chamber (100) to support the substrates (1) that are objects to be transferred so as to transfer the substrates (1); a rotation support (500) which is installed between the adjacent substrate supports (300) that are substrate transfer paths according to rotation driving of the transfer support (400) and on which the substrates (1) are seated to be rotated about a vertical second rotation axis ($C_2$) passing through the substrates (1); and a rotation power module (600) provided below the process chamber (100) to provide rotation power to each of the transfer support (400) and the rotation support (500).

The rotation power module (600) may include: a substrate transfer power part (610) configured to rotate the transfer support (400) about a vertical first vertical axis ($C_1$) so as to transfer the substrates (1); and a substrate rotation power part (620) configured to provide the rotation power to the rotation support (500) so that the substrates (1) are rotated at a preset angle about the second rotation axis ($C_2$) during the transfer process.

The substrate rotation power part (620) may include: a substrate rotation motor (621) configured to provide the rotation power; and a second rotation shaft (622) having one end connected to the substrate rotation motor (621) and the other end connected to the rotation support (500) so as to be rotated, and the substrate transfer power part (610) may include: a substrate transfer rotation motor (611) configured to provide the rotation power; and a first rotation shaft (612) having one end connected to the substrate transfer rotation motor (611) and the other end connected to the transfer support (400) so as to be rotated.

The rotation support (500) may include: N rotation plates (510) installed between N substrate supports (300) to seat the substrates (1), respectively, the N rotation plates (510) being configured to rotate the seated substrates (1) about the second rotation axis ($C_2$); and a power transmission part (520) configured to transmit rotation power provided from the substrate the rotation power part (620) to the rotation plates (510).

The transfer support (400) may include: a substrate seating blade (410) that is provided in at least one or more numbers and has a top surface on which a seating area, on which the substrate (1) is seated, is defined; and a coupling body (420) to which the substrate seating blade (410) is coupled and which is connected to the substrate transfer power part (610) so as to be installed to be rotatable with respect to the first rotation axis ($C_1$).

The coupling body (420) may include: a coupling body (421) that is disposed above the power transmission part (520) so that the substrate seating blade (410) is coupled; and a coupling body support (422) coupled to a bottom surface of the coupling body (421) by passing through the power transmission part (520) so as to be connected to the first rotation shaft (612).

The power transmission part (520) may include: a main rotation member (521) connected to the substrate rotation power part (620) so as to be rotated; a first pulley (522) coupled to a lower portion of the rotation plate (510); and a power transmission belt (523) wound around the main rotation member (521) and the first pulley (522) to transmit the rotation power of the main rotation member (521).

The power transmission part (520) may further include a second pulley (524) which is provided in plurality and on which the power transmission belt (523) is wound together with the main rotation member (521) and the first pulley (522) to convert an installation direction of the power transmission belt (523).

The power transmission part (520) may further include at least one first bearing (527) provided between a second rotation shaft (622), which is installed to pass through the main rotation member (521), and the main rotation member (521).

The rotation support (500) may include an installation space forming part (530) provided in the process chamber (100) to define an installation space in which the power transmission part (520) is installed therein.

The installation space forming part (530) may include: a main body (531) which has an internal space and is installed at a center of the bottom surface of the process chamber (100); and an extension part (532) provided to radially extend from the main body (531) so as to correspond to a position of the rotation plate (510).

The rotation support (500) may include: a purge gas inflow part provided in the main body (531) to supply a purge gas into the installation space forming part (530); and a purge gas outflow part provided in the extension part (532) to pump the supplied purge gas to the outside.

The substrate rotation motor (621) and the substrate transfer rotation motor (611) may be vertically disposed in a vertical direction, and the first rotation shaft (612) may pass through a through-hole defined in the substrate rotation motor (621) so as to be connected to the transfer support (400).

The rotation power module (600) may further include a magnetic fluid chamber (640) provided to surround the second rotation shaft (622).

The rotation power module (600) may further include a support assembly (630) provided to support each of the substrate transfer power part (610) and the substrate rotation power part (620).

The substrate processing apparatus may further include an elevation driving unit (700) configured to vertically move the rotation power module (600) so that the transfer support (400) is moved vertically.

The elevation driving unit (700) may include: an elevation power transmission part (710) connected to the support assembly (630); and an elevation driving source (720) configured to vertically move the support assembly (630) through the elevation power transmission part (710).

The elevation driving unit (700) may further include a bellows provided between the support assembly (630) and the process chamber (100).

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2A and 2B are plan views illustrating the configuration of the substrate processing apparatus of FIG. 1, wherein FIG. 2A is a plan view illustrating the substrate processing apparatus, in which a transfer support is mounted, and FIG. 2B is a plan view illustrating the substrate processing apparatus, in which the transfer support is removed;

DETAILED DESCRIPTION OF THE PREFERRED EMBODIMENTS

Figure 1:
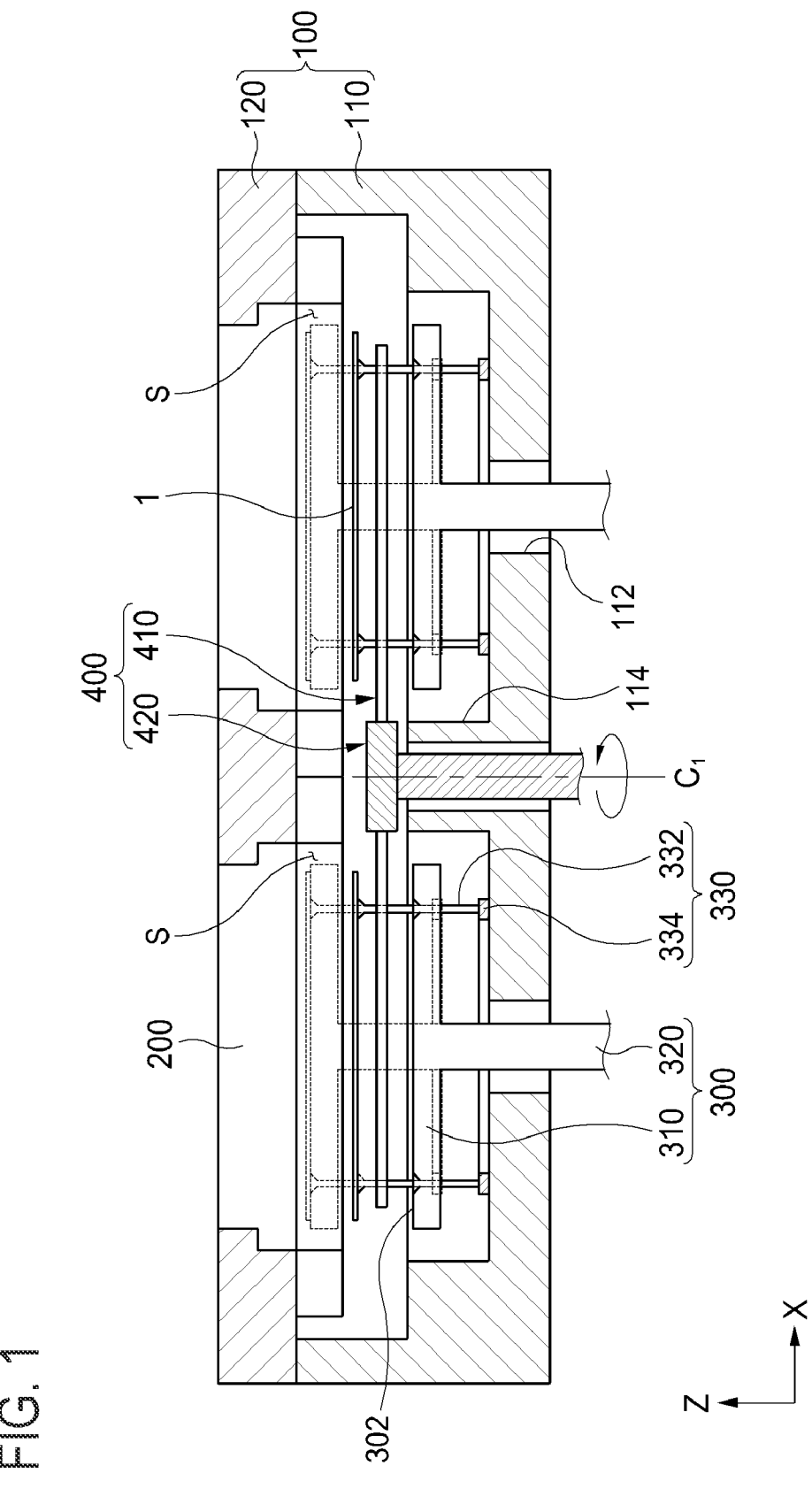
FIG. 1 is a schematic cross-sectional view illustrating a configuration of a substrate processing apparatus according to the present invention.

Hereinafter, a substrate processing apparatus according to the present invention will be described with reference to the accompanying drawings.

A substrate processing apparatus according to the present invention includes a process chamber 100 in which N processing spaces S (N is a natural number equal to or greater than 2) are defined to process substrates 1, N gas injection units 200 installed above the process chamber 100 to respectively correspond to the N processing spaces S so as to inject a gas into each of the processing spaces S, N substrate supports 300 that face the gas injection units 200 and support the substrates 1, a transfer support 400 installed in the process chamber 100 to support the substrates 1 that are objects to be transferred so as to transfer the substrates 1, a rotation support 500 installed on a substrate transfer path to seat the substrates 1 so that the substrates 1 are rotated about a vertical second rotation axis $C_2$ passing through the substrates 1, and a rotation power module 600 provided below the process chamber 100 to provide rotation power to each of the transfer support 400 and the rotation support 500.

In addition, the substrate processing apparatus according to the present invention may further include an elevation driving unit 700 that vertically moves the rotation power module 600 so that the transfer support 400 is moved vertically.

Each of the substrates 1 to be treated according to the present invention is a configuration in which substrate processing such as deposition and etching is performed, and any substrate such as a substrate for manufacturing a semiconductor, a substrate for manufacturing an LCD, a substrate for manufacturing an OLED, a substrate for manufacturing a solar cell, a transparent glass substrate, etc., is possible.

In addition, the substrate processing performed by the substrate processing apparatus according to the present invention may be a substrate processing process in which the substrate processing is performed in a processing space.

The process chamber 100 may have various configurations as a configuration for defining the processing space S for the substrate processing.

For example, the process chamber 100 may include a chamber body 110 having an opening at an upper side thereof and an upper lead 120 detachably coupled to the opening of the chamber body 110 to define the substrate processing space together with the chamber body 110.

In addition, the process chamber 100 may form N different processing spaces S (N is a natural number equal to or greater than 2) for the substrate processing on the plurality of substrates.

Each of the N processing spaces S may not be a space that is completely sealed within the process chamber 100, but may be a space that is spatially divided (separated).

For example, the process chamber 100 may define four processing spaces S arranged in a circumferential direction on a plane.

Here, as illustrated in FIG. 1, a substrate support seating groove 114 in which a substrate support 300 to be described later is disposed may be defined in the chamber body 110.

The substrate support seating groove 114 may be defined in a bottom surface of the chamber body 110.

When four substrate supports 300 are provided in the process chamber 100, four substrate support seating grooves 114 may be defined, respectively.

Since an internal space of the process chamber 100 is generally provided under a vacuum atmosphere, an exhaust groove (not shown) for discharging a process gas existing in each substrate support seating groove 114 and an exhaust port (not shown) may be provided in the bottom surface of the chamber body 110.

The exhaust port (not shown) may be connected to an exhaust line connected to a pump provided to the outside.

In addition, a through-hole into which a shaft 320 of the substrate support 300 to be described later is inserted may be defined in the bottom surface of the chamber body 110 for each of the substrate support seating grooves 114.

A gap may be defined between the substrate support seating groove 114 and the substrate support 300 to be described later, and thus, the process gas (raw material gas, plasma gas, cleaning gas, etc.), which is used for the substrate processing, may be introduced into the gap and then be exhausted through the exhaust port (not shown).

In addition, one or more gates (not shown) for loading and unloading the substrate 1 may be provided in the process chamber 100.

A power supply system for performing the substrate processing, an exhaust system for controlling a pressure of the processing space and exhausting the process gas may be connected to or installed in the process chamber 100.

The N gas injection units 200 may be installed above the process chamber 100 to correspond to the N processing spaces S, respectively, and may have various configurations for injecting a gas into the processing space S.

The gas injection unit 200 may be installed in a number corresponding to the number of processing spaces S and also may be installed above the process chamber 100 to inject the process gas into each of the processing spaces S.

For example, the gas injection unit 200 may include a gas inflow part (not shown) installed in the upper lead 120 and provided at one side thereof, one or more diffusion plates (not shown) that diffuse the process gas introduced through the gas inflow part, and a plurality of injection holes (not shown) through which the diffused process gas is injected toward the processing space S.

The N substrate supports 300 may be configured to have a substrate seating surface 302 facing the gas injection unit 200 and supporting the substrate 1 and may have various configurations.

The substrate support 300 may be installed to correspond to each of the gas injection units 200 and may be installed to vertically face the gas injection units 200.

For example, as illustrated in FIG. 1, the substrate support 300 may include a substrate support plate 310, on which the substrate seating surface 302 that supports the substrate 1 is disposed, and a substrate shaft 320 coupled to a bottom surface of the substrate support plate 310 to support the substrate support plate 310 and installed to be vertically movable by a vertical driving part (not shown).

The substrate support plate 310 may be provided as a plate having a shape corresponding to a planar shape of the substrate 1.

In addition, a heater (not shown) for heating the substrate 1 supported on the substrate seating surface 302 may be built in the substrate support plate 310.

The N substrate supports 300 may be installed at equal intervals along a circumferential direction around a central portion of the process chamber 100.

The substrate support 300 may be a vacuum chuck or an electrostatic chuck for adsorbing and fixing the supported substrate 1.

The shaft 320 may be a shaft that is coupled to the substrate support plate 310 to support the substrate support plate 310, and the shaft 320 may pass through an opening 112 passing through a lower wall of the process chamber 100 so as to be coupled to the bottom surface of the support plate 310 and may be coupled to be movable vertically by a separate ascending/descending driving unit outside the process chamber.

Here, the substrate processing apparatus may further include a substrate lift unit 330 installed on a lower portion of the substrate support plate 310 to lift the substrate 1 so as to be vertically spaced apart from the substrate seating surface 302.

The substrate lift unit 330 may be configured to support the substrate 1 in a state in which the substrate 1 is vertically spaced apart from the substrate seating surface 302 when the substrate 1 is loaded into, unloaded from, or transferred within the process chamber 100 and may have various configurations.

The substrate lift unit 330 may include a plurality of lift pins 332 that support a bottom surface of the substrate 1 by vertically passing through the substrate support plate 310 and a lift pin body 334 coupled to the plurality of lift pins 332 so as to be disposed on the lower portion of the substrate support plate 310.

Here, a through-hole through which each of the lift pins 332 passes may be defined in the substrate support plate 310.

A substrate support area that is a contact area in contact with the bottom surface of the substrate 1 and has a tapered shape so that a horizontal cross-section thereof becomes wider upward may be disposed on an upper end of an upper portion of the lift pin 332.

As a diameter of the substrate support area is wider than that of the through-hole of the substrate support plate 310, the substrate support area may be physically caught above the through-hole so as not to be separated downward from the substrate support plate 310.

Here, a recessed part defined in a shape corresponding to the shape of the substrate support area may be defined above the through-hole.

The substrate support area may be seated in the recessed part when the substrate support plate 310 ascends and thus may be maintained so as not to protrude upward from the substrate seating surface 302 of the substrate support plate 310.

The lift pin body 334 may be disposed under the substrate support plate 310 to serve as a body to which the plurality of lift pins 332 are coupled and may have various configurations.

For example, the lift pin body 334 may be provided in a ring shape surrounding the shaft 320, and in this case, the plurality of lift pins 332 may be equally spaced along a circumference of the lift pin body 334.

The lift pin body 334 may be moved vertically in interlock with the vertical movement of the substrate support 300 without a separate driving unit because the substrate support area is supported by the recessed part above the through-hole.

That is, when the substrate support 300 is moved upward over a certain range, the lift pin body 334 supported on the bottom of the process chamber 100 may be moved upward together with the substrate support 300 by the recessed part of the substrate support 300, and then, when the substrate support 300 is moved downward again, the lift pin body 334 may also be moved downward together.

As the substrate support 300 is moved downward, the lift pin body 334 may be supported on the bottom of the process chamber 100, and thus, the substrate support area may protrude upward from the recessed part above the through-hole so that the lift pins 332 supports the substrate 1 in a state in which the substrate 1 is vertically spaced apart from the substrate seating surface 302.

The transfer support 400 may be installed in the process chamber 100 to support the substrates 1 that are objects to be transferred and may have various configurations.

Here, the transfer support 400 may be installed in the process chamber 100 to transfer the substrate 1 from one of the N substrate supports 300 to the other substrate support 300.

In addition, the transfer support 400 may transfer the substrate 1 from one substrate support 300 to a rotation support 500 to be described later or may transfer the substrate 1 from the rotation support 500 to one or another substrate support 300.

For example, the transfer support 400 may include a substrate seating blade 410 that is provided in at least one or more numbers and has a top surface on which a seating area, on which the substrate 1 is seated, is defined, and a coupling body 420 coupled to the substrate seating blade 410, connected to the substrate transfer power part 610, and installed to be rotatable with respect to a vertical direction.

The substrate seating blade 410 may enter between the substrate 1 lifted upward by the lift pins 332 of the substrate support 300 and the substrate seating surface 302 to define the seating area on which the corresponding substrate 1 is supported and may have various configurations.

The substrate seating blade 410 may be provided in numbers corresponding to the N number of substrate supports 300 and may be radially coupled to the coupling body 420.

The substrate seating blade 410 may be made of various materials depending on process environments, but is limited thereto. For example, the substrate seating blade 410 may be made of a material that is strong against high temperature and has corrosion resistance when being exposed to the process environments. For example, the substrate seating blade 410 is made of a ceramic material and may be provided by ceramic processing, but are not limited thereto.

Figure 2A:
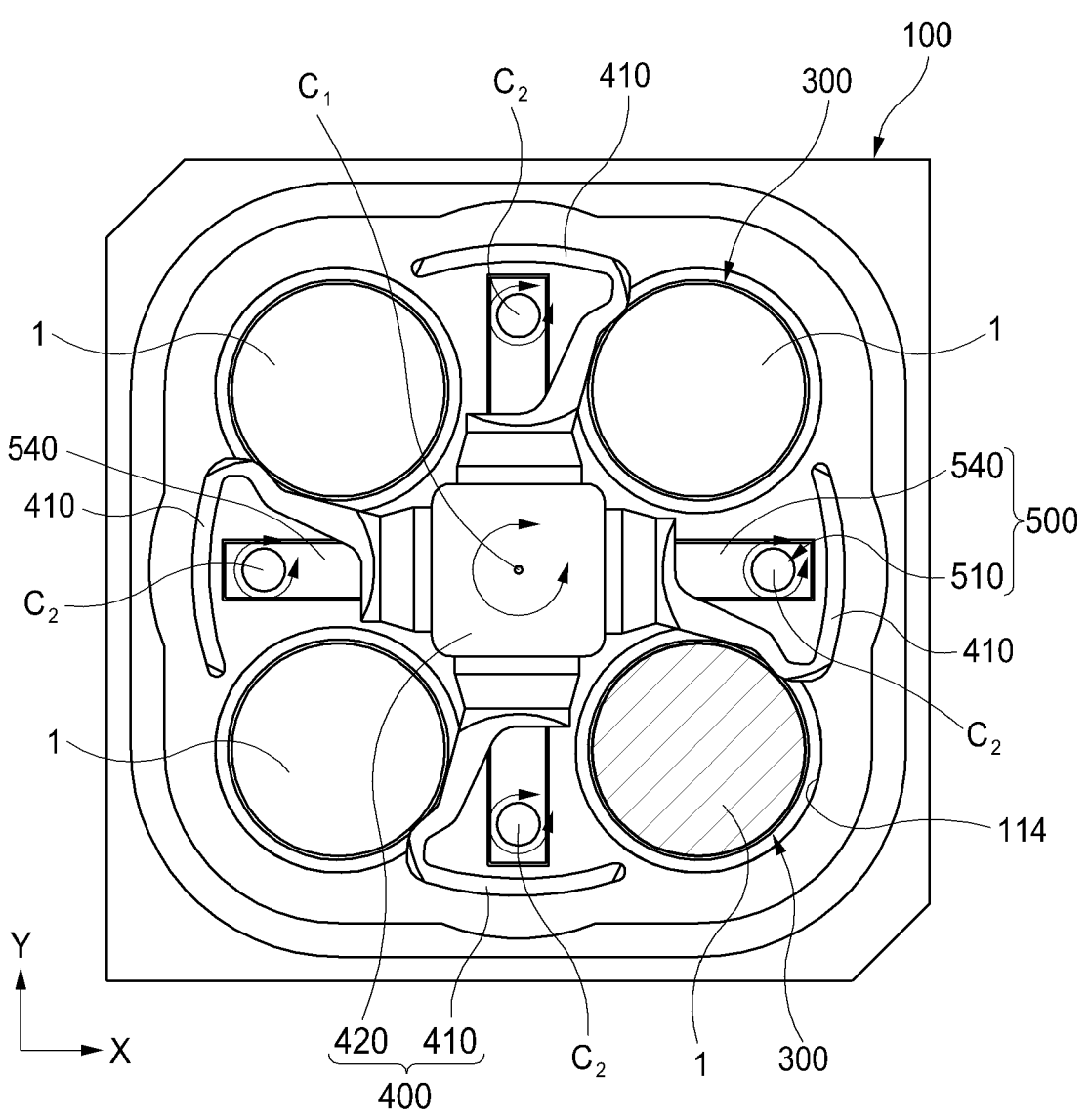
Figure 2B:
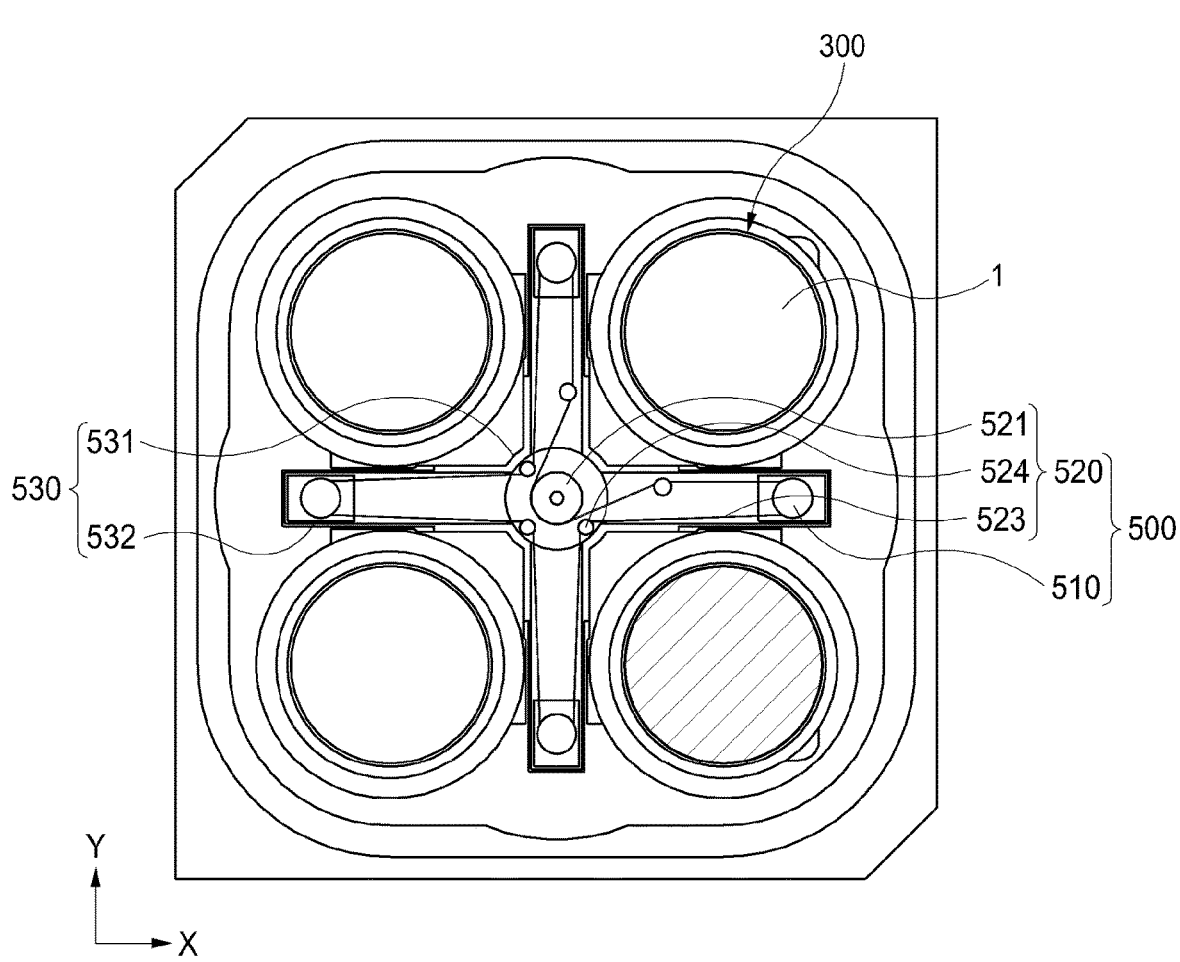
Figure 3:
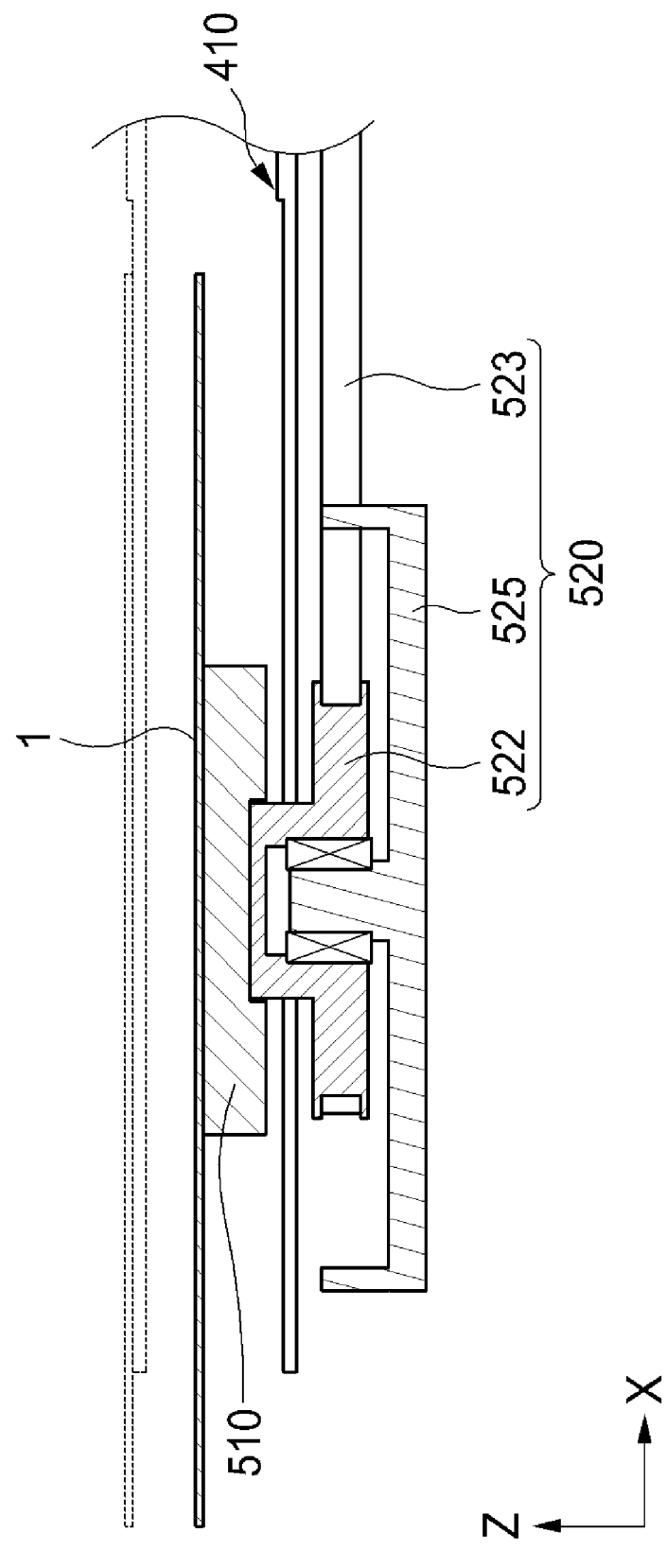
FIG. 3 is a cross-sectional view illustrating a state before and after a substrate is seated on the rotation support in the substrate processing apparatus of FIG. 1.

In addition, the substrate seating blade 410 may be provided in various shapes as long as the substrate seating blade 410 stably transfers or receive the substrate 1 without interference with the lift pins 332. For example, as illustrated in FIGS. 2A and 2B, the substrate seating blade 410 may be provided in the form of a hook.

The coupling body 420 may be a configuration in which at least one substrate seating blade 410 is coupled and which is connected to a substrate transfer power part 610 to be described later so as to be rotatably installed with respect to the vertical direction.

That is, the coupling body 420 may receive power through the substrate transfer power part 610 to be described later so as to be rotated around a first rotation axis $C_1$ in the vertical direction passing through a center thereof, thereby rotating the substrate seating blade 410 that is radially coupled so as to transfer the substrate 1.

For example, the coupling body 420 may include a coupling body 421 that is disposed above a main body 531 to be described later, which is a central side of the rotation support 500, so that the substrate seating blade 410 is coupled, and a coupling body support 422 coupled to a bottom surface of the coupling body 421 by passing through the power transmission part 520 so as to be connected to the first rotation shaft 612.

The coupling body 421 may be disposed above the center of the rotation support 500 so that at least one substrate seating blade 410 is coupled through screw coupling and may be rotated through the coupling body support 422 and the substrate transfer power part 610 connected to the coupling body support 422 to rotate the coupling body support 422.

The coupling body support 422 may have one end coupled to the bottom surface of the coupling body 421 so as to be connected to the substrate transport power part 610 to be described later and the other end connected to the substrate transfer power part 610 by passing through the power transmission part 520 disposed between the coupling body 421 and the substrate transport power part 610.

Here, the coupling body support 422 may be connected to the first rotation shaft 612 of the substrate transfer power part 610 by passing through the power transmission part 520 without interference and contact with the power transmission part 520. More specifically, the first rotation shaft 612 may be inserted into a connection hole defined in the coupling body support 422 so that the coupling body support 422 is rotated according to the rotation of the first rotation shaft 612.

The coupling body support 422 may be coupled to the bottom surface of the coupling body 421 to transmit rotation power to the coupling body 421 and the substrate seating blade 410 and also may rotate the coupling body 421 due to the interference with the coupling body 421 because the coupling body support 422 is disposed on the bottom surface of the coupling body 421 so as to be rotated simply.

In addition, the coupling body 420 may be movable vertically together through an elevation driving unit 700 to be described later of the rotation power module 600 including the substrate transfer power part 610, thereby transferring the substrate 1 through the substrate seating blade 410.

In this case, the coupling body 420 may be movable vertically at the upper side of the power transmission part 520 and may be movable vertically without the interference in the state in which the coupling body support 422 passes through the power transmission part 520.

The rotation support 500 may be configured to rotate the substrate 1 about the second vertical axis $C_2$ passing through the substrate 1 and may have various configurations.

For example, the rotation support 500 may include at least one rotation plate 510 on which the substrate 1 is seated and which rotates the seated substrate 1 about the vertical rotation axis passing through the substrate 1, and the power transmission part 520 that transmits rotation power to the rotation plate 510.

In addition, the rotation support 500 may further include the main body 531 which is installed on the bottom surface of the process chamber 100 and in which the power transmission part 520 is installed, and an installation space forming part 530 which is radially disposed on the main body 531 and includes an extension part 532, on which the rotation plate 510 is installed, at an inner end thereof.

In addition, the rotation support 500 may include a purge gas inflow part provided in the main body 531 to supply a purge gas into the installation space forming part 530 and a purge gas outflow part provided in the extension part 532 to pump the supplied purge gas to the outside.

The rotation plate 510 may be a configuration on which the substrate 1 is seated and which rotates the seated substrate 1 about the second rotation axis $C_2$ that is a vertical rotation axis passing through the substrate 1.

That is, the rotation plate 510 may be rotated about the second rotation axis $C_2$ in the vertical direction at the center to rotate the substrate 1 seated on a top surface thereof about the second rotation axis $C_2$.

Here, the rotation plate 510 may be coupled to an upper portion of a first pulley 522 to be described later and thus be rotated according to the rotation of the first pulley 522 and may have an appropriate size so that the hook-shaped substrate seating blade 410 is vertically movable without the interference.

In this case, since the substrate 1 is seated and rotated on the rotation plate 510 in a state in which the rotation plate 510 has a small planar area compared to the substrate 1, the substrate may not be smoothly rotated. Thus, the rotation plate 510 may be provided as an electrostatic chuck or a vacuum chuck that adsorbs the substrate 1 or may be made of a material that increases in friction with the substrate 1 so as to support the substrate 1.

The rotation plate 510 may be installed at at least one of the N substrate supports 300. For example, N rotation plates 510 may be disposed between the substrate supports 300 to simultaneously rotate the N substrates 1 supported by the N substrate supports 300, respectively.

Thus, the rotation plate 510 may be disposed between the N substrate supports 300, and the substrate rotation power part 620, which will be described later, may be disposed to be connected to the rotation plates 510 from a center of the plane of the process chamber 100 so as to provide the rotation power to the rotation plates 510.

The power transmission part 520 may be configured to transmit the rotation power to the rotation plate 510.

For example, the power transmission part 520 may include a main rotation member 521 connected to the substrate rotation power part 620 so as to be rotated, a first pulley 522 coupled to a lower portion of the rotation plate 510, and a power transmission belt 523 wound around the main rotation member 521 and the first pulley 522 to transmit the rotation power of the main rotation member 521.

In addition, the power transmission part 520 may further include a second pulley 524 which is provided in plurality and on which the power transmission belt 523 is wound together with the main rotation member 521 and the first pulley 522 to convert an installation direction of the power transmission belt 523.

In addition, the power transmission part 520 may further include at least one first bearing 527 provided between a second rotation shaft 622, which is installed to pass through the main rotation member 521, and the main rotation member 521 and at least one second bearing 528 the main rotation member 521 and the main body 531 on which the main rotation member 521 is installed.

The main rotation member 521 may be connected to the substrate rotation power part 620 so as to be rotated and may be installed by being inserted into the main body 531 of the installation space forming unit 530 to be described later.

Here, the main rotation member 521 may be connected to the substrate rotation power part 620 to be described later so as to be rotated, and more specifically, may have a through-part 529, into which the second rotation shaft 622 of the substrate rotation power part 620 is inserted, so that the main rotation member 521 is rotated together due to the interference with the rotation of the second rotation shaft 622.

Here, at least one through-part 529 may be defined in a circumferential direction with respect to a center thereof. For example, a pair of through-parts 529 may be provided symmetrically so that a pair of second rotation shafts 622 are inserted and rotated respectively to rotate the main rotation member 521.

In this case, the through-part 529 may be provided to correspond to a cross-sectional shape of the second rotation shaft 622 and may have a planar shape such as a circular shape or a polygonal shape.

As a result, the main rotation member 521 may rotate the connected power transmission belt 523 to finally rotate the first pulley 522 and the rotation plate 510 coupled to an upper portion of the first pulley 522.

For this, the main rotation member 521 may be installed so that the power transmission belt 523 is wound around at least a portion of a circumference thereof and may rotate at least a portion of the power transmission belt 523 in both directions through the rotation thereof to rotate at least one first pulley 522 connected to the power transmission belt 523 in both the directions.

The first pulley 522 may be installed at the inner end of the extension part 532, and at least one, for example, N first pulleys 522 may be provided to correspond to the rotation plates 510 coupled to an upper portion thereof.

Thus, the first pulley 522 may be rotated together when the main rotation member 521 is rotated and may be installed to be movable within the process chamber 100 to maintain tension of the power transmission belt 523 wound around an outer circumferential surface thereof at a certain level or more.

The power transmission belt 523 may be wound around the main rotation member 521 and the first pulley 522 to transmit the rotation power of the main rotation member 521.

Figure 5:
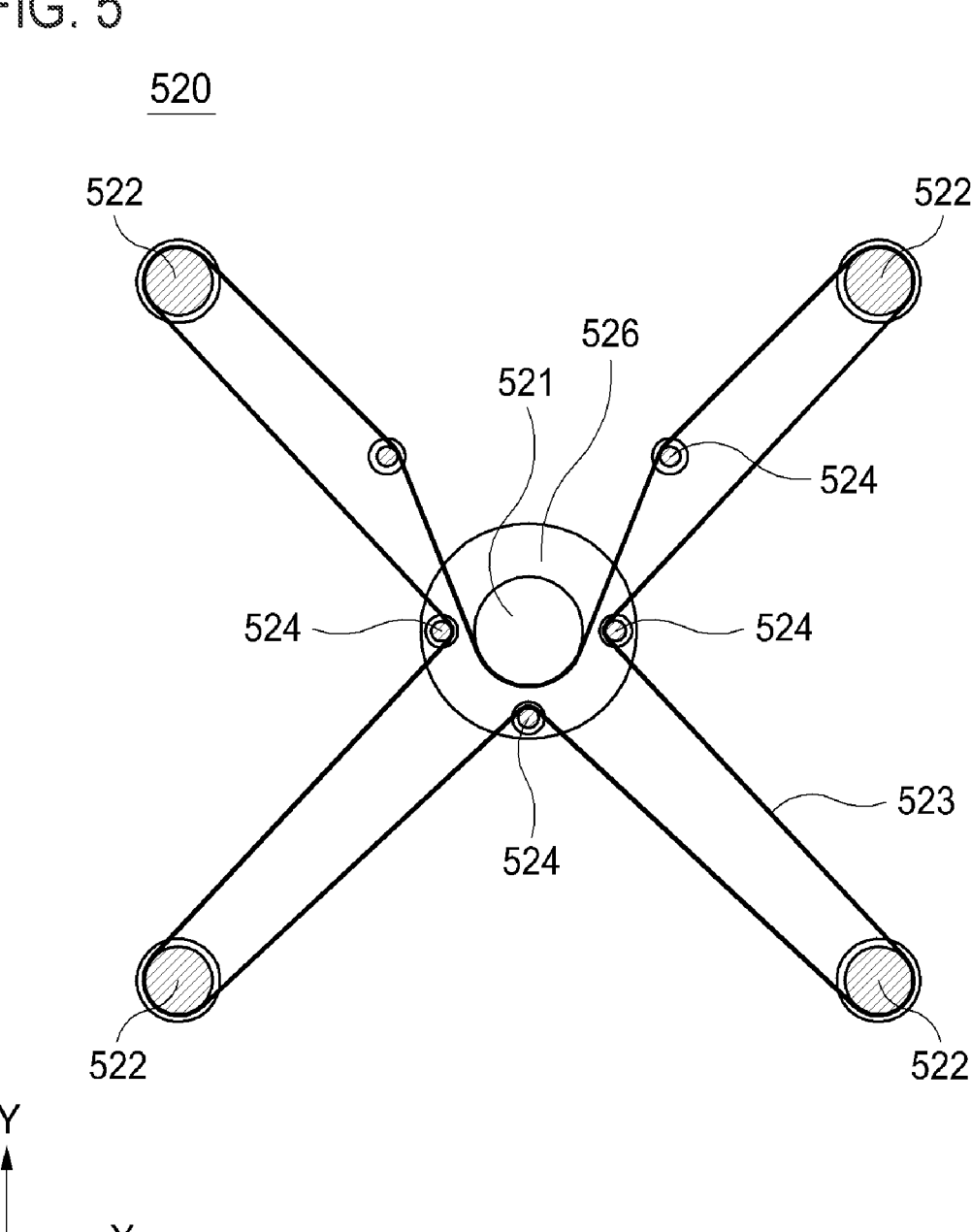
FIG. 5 is a plan view illustrating a state in which a power transfer belt is installed in the rotation support of FIG. 4.

That is, as illustrated in FIG. 5, the power transmission belt 523 may be installed to be wound around at least a portion of an outer circumferential surface of each of the first pulley 522 and the second pulley 524, which are provided in plurality with respect to the main rotation member 521, and thus, the plurality of first pulleys 522 may be rotated according to the rotation of the single main rotation member 521 by using a single power transmission belt 523.

The second pulley 524 may be appropriately provided in plurality to be adjacent to the main rotation member 521 and between the main rotation member 521 and the first pulley 522 to convert the installation direction of the power transmission belt 523.

The first bearing 527 may be provided between the second rotation shaft 622 installed to pass through the main rotation member 521 and the main rotation member 521 and may be installed to be smoothly rotated within the through-part 529 of the second rotation shaft 622.

Here, as illustrated in the drawings, the first bearing 527 may be applied as a single configuration according to the second rotation shaft 622, and as another example, a plurality of first bearings 527 may be installed vertically spaced apart from each other.

The second bearing 528 may be provided between the main rotation member 521 and the main body 531 on which the main rotation member 521 is installed and may be installed so that the main rotation member 521 is smoothly rotate within the main body 531.

In addition, the driving transmission part 520 may include a first pulley support 525 and a second pulley support 526, which are respectively provided under the first pulley 522 and the second pulley 524 to support the first pulley 522 and the second pulley 524.

The first pulley support 525 may be installed under the first pulley 522 to support the first pulley 522 and may be provided in plurality to correspond to the first pulley 522 and be installed on the inner end of the extension part 532.

The second pulley support 526 may be installed at a position adjacent to the main rotation member 521 on a top surface of the main body 531, and the plurality of second pulleys 524 may be installed on a top surface of the second pulley support 526.

The installation space forming part 530 may include a main body 531 which is installed on the bottom surface of the process chamber 100 and in which the power transmission part 520 is installed, and an extension part 532 which is radially disposed on the main body 531 and on which the rotation plate 510 is installed on an inner end thereof.

That is, the installation space forming part 530 may be provided with the main body 531 at a central portion thereof to correspond so that the main rotation member 521, the first pulley 522, and the power transmission belt 523 connecting the main rotation member 521 to the first pulley 522 are stably installed, and the extension part 532 radially extending from the main body 531.

Figure 4:
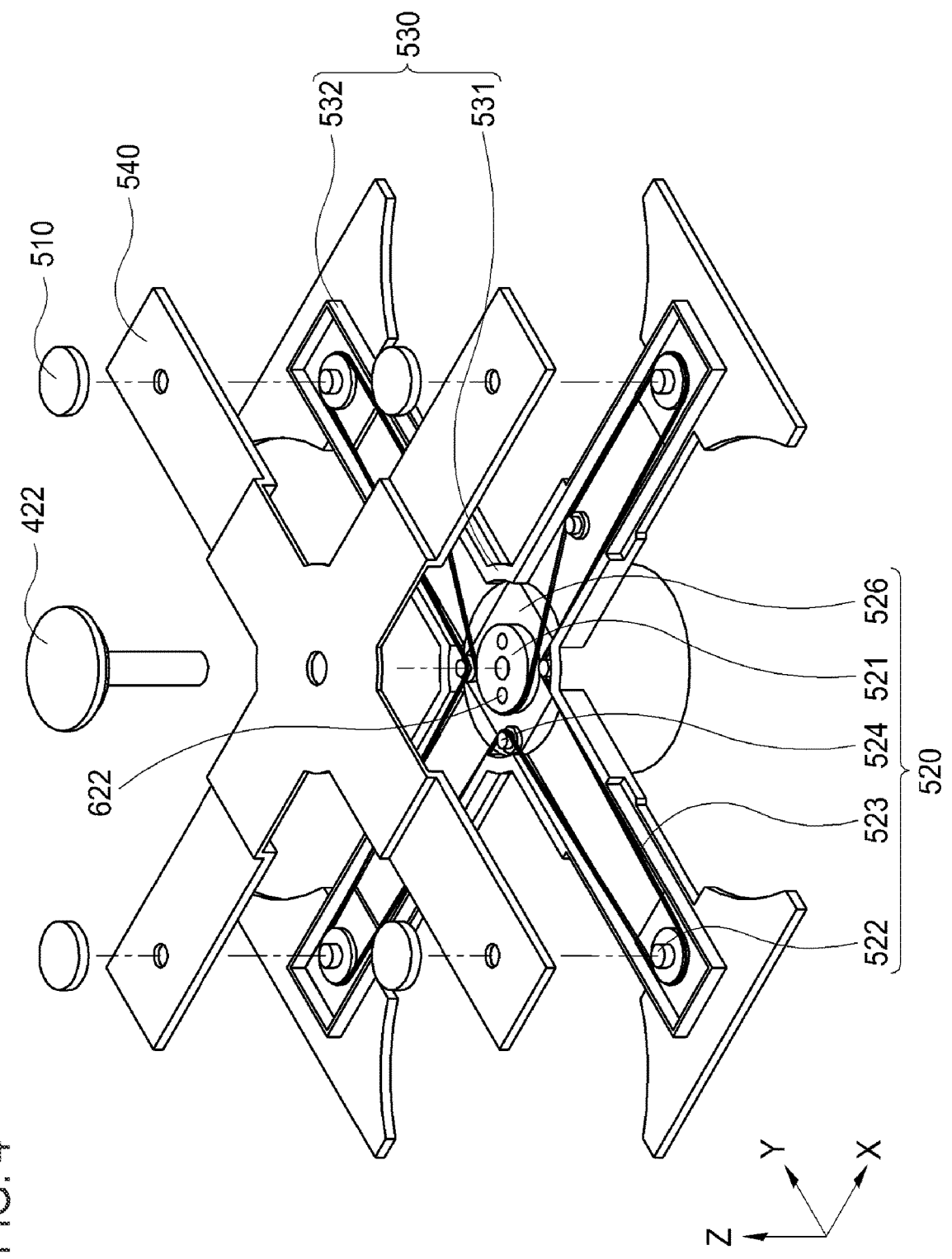
FIG. 4 is a perspective view illustrating a configuration of the rotation support in the substrate processing apparatus of FIG. 1.

In addition, the installation space forming part 530 may be provided as a single configuration having an internal space, and as another example, may further include a separate upper cover part 540 as illustrated in FIG. 4.

Here, the above-described rotation plate 510 may be installed to be exposed on an upper portion of the cover part 540 and may pass through the cover part 540 so as to be connected to the first pulley 522 installed inside the installation space forming part 530.

The main body 531 may be installed to pass through the bottom surface of the process chamber 100 and may have a cylindrical shape in which a hollow is defined.

Thus, the main rotation member 521, the first rotation shaft 612, and the second rotation shaft 622 may be installed in the main body 531, and the main body 531 may be configured to connect each of the rotation power module 600 disposed therebelow, the rotation support 500, and the transfer support 400.

The extension part 532 may extend radially from the main body 531 and may be provided in a corresponding shape between the substrate supports 300.

The purge gas inflow part may be provided in the main body 531 to supply the purge gas into the installation space forming part 530 and may be connected to an external supply source to supply and induce the purge gas toward the extension part 532 through the main body 531.

The purge gas outflow may be provided in the extension part 532 to pump the supplied purge gas to the outside and may be connected to an external pump to pump the supplied purge gas, thereby continuously inducing the purge gas supplied toward the main body 531 to the extension part 532.

The rotation power module 600 may be provided below the process chamber 100 to provide the rotation power to each of the transfer support 400 and the rotation support 500.

For example, the rotation power module 600 may include a substrate transfer power part 610 that rotates the transfer support 400 about the vertical first vertical axis $C_1$ to transfer the substrates 1 and a substrate rotation power part 620 that provides the rotation power to the rotation support 500 so that the substrates 1 are rotated at a preset angle about the second rotation axis $C_2$ during the transfer process.

In addition, the rotation power module 600 may further include a magnetic fluid chamber 640 provided between the process chamber 100 or the installation space forming part 530.

In addition, the rotation power module 600 may further include a support assembly 630 provided to support each of the substrate transfer power part 610 and the substrate rotation power part 620 in the vertical direction.

The support assembly 630 may be configured to support each of the substrate transfer power part 610 and the substrate rotation power part 620 in the vertical direction and may have various configurations.

Figure 7:
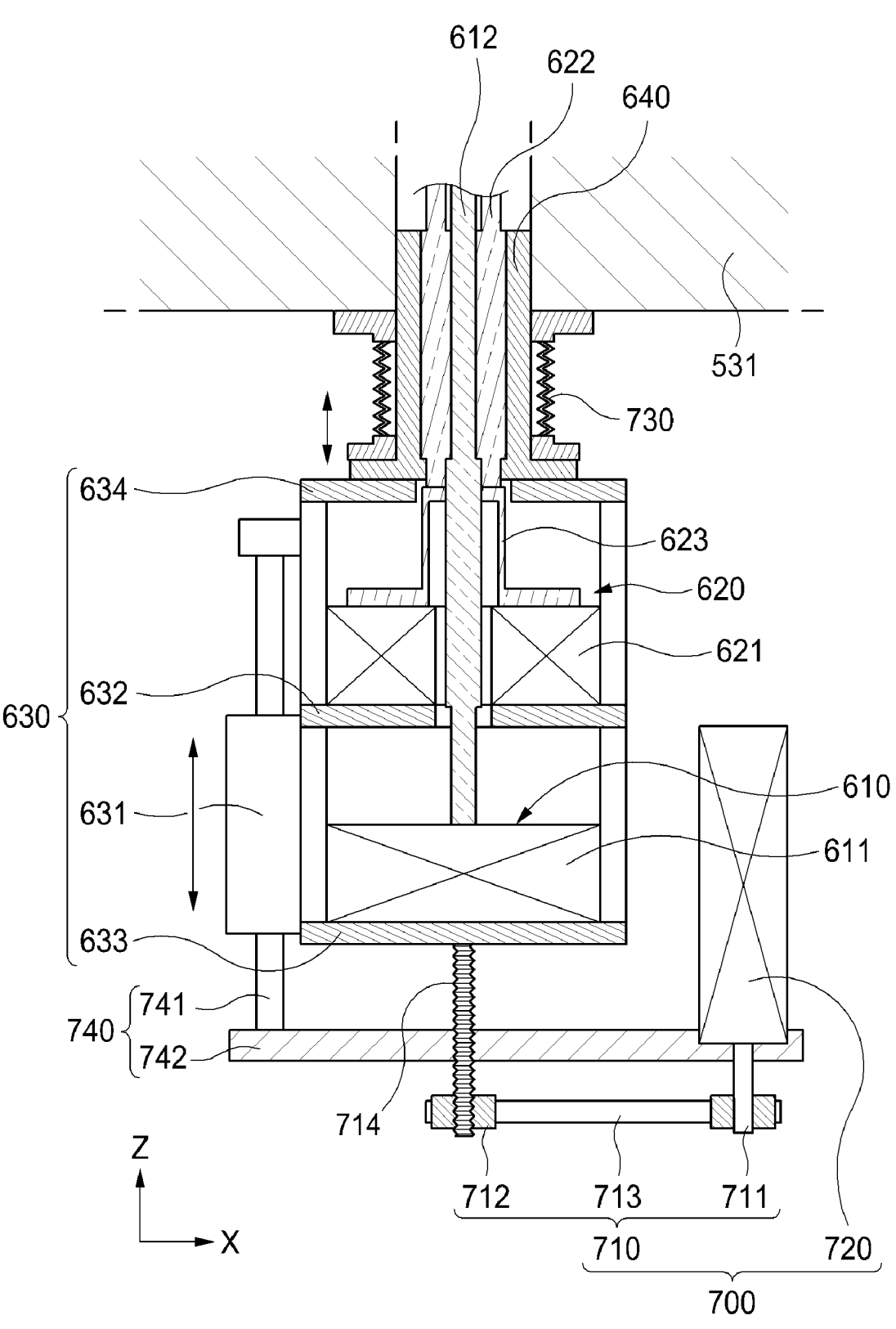
FIG. 7 is a cross-sectional view illustrating a configuration of a lower portion of the power transfer part in the substrate processing apparatus of FIG. 1.

For example, as illustrated in FIG. 7, the support assembly 630 may include a first support 633 supporting the substrate transfer power part 610, a second support 632 supporting the substrate rotation power part 620, and an uppermost support 634 installed at the uppermost end thereof.

More specifically, the support assembly 630 may include an upper second support 632 and a lower first support 633, which are spaced vertically from each other to the substrate transfer power part 610 and the substrate rotation power part 620, which are disposed in the vertical direction, respectively.

In addition, the uppermost support 634 may be provided so that a bellows 730 to be described later is installed between the uppermost support 634 and the bottom surface of the process chamber 100 or the bottom surface of the substrate rotation housing 531.

The support assembly 630 may further include a guide part 631, which is connected to the first support 633, the second support 632, and the uppermost support 634 to guide an elevation driving unit 700 to be described later, on a side surface thereof. Here, an LM guide may be applied as the guide part 631.

Each of the first support 633 and the uppermost support 634 may have a center penetrated so that a first rotation shaft 612 extending from the substrate transfer power part 610, which will be described later, passes through the center.

The substrate transfer power part 610 may be supported by the lower first support 633 and be connected to the transfer support 400 to provide the rotation power and may have various configurations.

For example, the substrate transfer power part 610 may include a substrate transfer rotation motor 611 providing the rotation power and a first rotation shaft 612 having one end connected to the substrate transfer rotation motor 611 and the other end connected to the transfer support 400 so as to be rotated.

More specifically, the substrate transfer power part 610 may include a first rotation shaft 612 connected to extend upward in a state in which the substrate transfer rotation motor 611 is installed to be supported by the first support 633.

Here, the first rotation shaft 612 may be connected to the substrate transfer rotation motor 611 and thus be connected along the first rotation axis $C_1$ and may pass through the second support 632 and the uppermost support 634 to extend in an upward direction.

Figure 6:
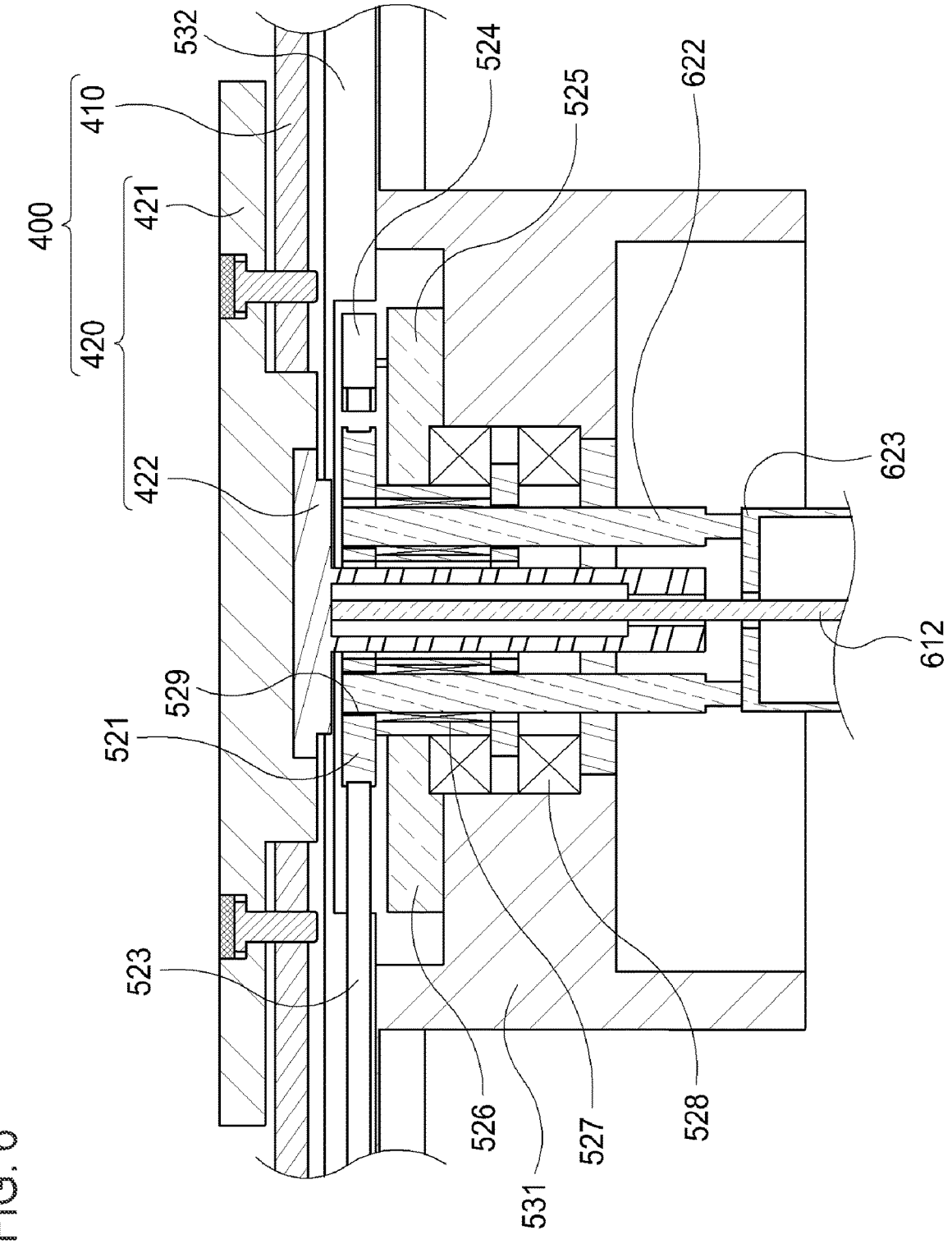
FIG. 6 is a cross-sectional view illustrating a configuration of an upper portion of a power transfer part in the substrate processing apparatus of FIG. 1.

Thus, as illustrated in FIG. 6, the first rotation shaft 612 may be connected to a coupling body support 421 by passing through a second rotation shaft connection part 623 and may rotate the coupling body support 421 to rotate the transfer support 400.

Here, an end of the first rotation shaft 612 may be coupled to be rotated integrally with the coupling body support 421, and as another example, at least a portion of the first rotation shaft 612 may be inserted into a groove defined in the coupling body support 421 so as to be integrally rotated through an interference.

Furthermore, the end of the first rotation shaft 612 may be coupled to the coupling body support 421 to allow the coupling body support 421 to ascend or descend through ascending or descending of the support assembly 630 according to the elevation driving unit 700 to be described later, thereby vertically moving the transfer support 400.

The substrate rotation power part 620 may be disposed vertically above the substrate transfer power part 610 to provide the rotation power to the power transmission part 520 and may have various configurations.

For example, the substrate rotation power part 620 may include a substrate rotation motor 621 supported on the second support 632 to provide the rotation power and a second rotation shaft 622 having one end connected to the substrate rotation motor 621 and the other end connected to the power transmission part 520 so as to be rotated.

In addition, the substrate rotation power part 620 may further include a second rotation shaft connection part 623 connecting the second rotation shaft 622 to the substrate rotation motor 621.

Here, the substrate rotation power part 620 may have a hollow so that the above-described first rotation shaft 612 is installed to pass through the center.

That is, the substrate rotation power part 620 may be disposed above the substrate transfer power part 610 and may have a through-hole so that the first rotation shaft 612 passes through the through-hole so as to be connected to the transfer support 400.

The substrate rotation motor 621 may be disposed to overlap the substrate transfer rotation motor 611 in the vertical direction on the second support 632 to provide the rotation power.

The second rotation shaft 622 may be disposed in plurality around the first rotation shaft 612 and may be inserted into and interfere with the through-part 529 defined in the above-described main rotation member 521 to rotate the main rotation member 521 through the rotation thereof.

For this, the second rotation shaft 622 may be connected to the substrate rotation motor 621 to extend upward, and a plurality of the second rotation shafts 622 may be disposed around the first rotation shaft 612.

The second rotation shaft connection part 623 may have a ring-shaped structure in which the plurality of second rotation shafts 622 are coupled at a lower end thereof and may have a top surface, to which the plurality of second rotation shafts 622 are coupled, and a bottom surface extending to be connected to the substrate rotation motor 621.

Here, the second rotation shaft connection part 623 may be provided in a ring shape so that the first rotation shaft 612 passes through a center of the second rotation shaft connection part 623.

The magnetic fluid chamber 640 may be provided to surround the second rotation shaft 622 and may have various configurations.

For example, the magnetic fluid chamber 640 may be provided to be smoothly maintained in vacuum and sealing even in the rotation of the second rotation shaft 622 and the first rotation shaft 612 disposed inside the second rotation shaft 622 and may also have any configuration according to the related art.

In this case, the magnetic fluid chamber 640 may be provided to surround the first rotation shaft 612 and the plurality of second rotation shafts 622 disposed adjacent to an outer circumferential surfaces of the first rotation shaft 612 and may be installed on the bottom surface of the process chamber 100 or between the installation space forming part 530 and the uppermost support 634 to perform the sealing.

The elevation driving unit 700 may be configured to vertically move the rotation power module 600 so that the transfer support 400 is moved vertically and may have various configurations.

For example, as illustrated in FIG. 7, the elevation driving unit 700 may include an elevation power transmission part 710 connected to the support assembly 630 and an elevation driving source 720 that vertically moves the support assembly 630 through the elevation power transmission part 710.

In addition, the elevation driving unit 700 may further include a bellows 730 provided between the support assembly 630 and the bottom surface of the main body 531 according to the vertical movement.

In addition, the elevation driving unit 700 may further include an elevation support 740 connected to the support assembly 630 to support the elevation power transmission part 710.

The elevation driving source 720 may include a driving motor or a cylindrical actuator that is supported and installed at a lower end of the support assembly 630.

The elevation power transmission part 710 may include elevation pulley parts 711 and 712 that connect the elevation drive source 720 to the support assembly 630, an elevation belt part 713 that transmits driving between each of the elevation pulley parts 711 and 712 and each of the elevation drive source 720 and the support assembly 630, and an elevation shaft 714 having one end connected to any one of the elevation pulley parts 711 and 712 and the other end connected to the first support 633 to vertically transmit the rotation power transmitted from the elevation driving source 720 via the elevation pulley parts 711 and 712 so that the support assembly 630 is vertically moved.

For example, the elevation shaft 714 may be installed to pass through the elevation support 740 so as to be bolted to the elevation support 740 and may be moved according to the rotation of the elevation pulley part 712 in a state in which one end of the elevation shaft 714 is coupled to an output-side pulley part of the elevation pulley parts 711 and 712, and the other end of the elevation shaft 714 is coupled to a bottom surface of the first support 633, thereby vertically moving the support assembly 630.

Therefore, the elevation driving unit 700 may vertically move the support assembly 630 and also may vertically move the transfer support 400 because the first rotation shaft 612 ascends or descends due to the movement of the support assembly 630.

In the substrate processing apparatus, in which the plurality of processing spaces are defined to perform the substrate processing on the plurality of substrates, the substrate processing apparatus according to the present invention may have the advantage that the substrate is rotated about the vertical rotation axis passing through the substrate to improve the process uniformity through the rotation of the substrate.

In addition, the substrate processing apparatus according to the present invention may have the structure, in which the substrate transfer power part that provides the power to the transfer support to transfer the plurality of substrates and the substrate rotation power part that provides the power to the rotation support to self-rotate each of the plurality of substrates are modularized, to realize the rotation of the substrate without expanding the limited internal space of the process chamber.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing apparatus comprising:
a process chamber in which N processing spaces are defined to process substrates;
N gas injection units installed above the process chamber to respectively correspond to the N processing spaces so as to inject a gas into each of the processing spaces;
N substrate supports that face the gas injection units and support the substrates;
a transfer support installed in the process chamber to be rotatable, configure to support the substrates to be transferred and transfer the substrates from one of the N substrate supports to another substrate support;
a rotation support fixedly installed between the adjacent substrate supports separately from the transfer support, configured to support the substrates delivered via the transfer support and to rotate the seated substrates about a vertical second rotation axis passing through the substrates; and
a rotation power module provided below the process chamber to provide rotation power to each of the transfer support and the rotation support.

2. The substrate processing apparatus of claim 1, wherein the rotation power module comprises:
a substrate transfer power part configured to rotate the transfer support about a vertical first vertical axis so as to transfer the substrates; and
a substrate rotation power part configured to provide the rotation power to the rotation support so that the substrates are rotated at a preset angle about the second rotation axis during the transfer process.

3. The substrate processing apparatus of claim 2, wherein the substrate rotation power part comprises:
a substrate rotation motor configured to provide the rotation power; and
a second rotation shaft having one end connected to the substrate rotation motor and the other end connected to the rotation support so as to be rotated, and the substrate transfer power part comprises:
a substrate transfer rotation motor configured to provide the rotation power; and
a first rotation shaft having one end connected to the substrate transfer rotation motor and the other end connected to the transfer support so as to be rotated.

4. The substrate processing apparatus of claim 3, wherein the rotation support comprises:

N rotation plates installed between N substrate supports to seat the substrates, respectively, the N rotation plates being configured to rotate the seated substrates about the second rotation axis; and
a power transmission part configured to transmit rotation power provided from the substrate the rotation power part to the rotation plates.

5. The substrate processing apparatus of claim 4, wherein the transfer support comprises:
a substrate seating blade that is provided in at least one or more numbers and has a top surface on which a seating area, on which the substrate is seated, is defined; and
a coupling body to which the substrate seating blade is coupled and which is connected to the substrate transfer power part so as to be installed to be rotatable with respect to the first rotation axis.

6. The substrate processing apparatus of claim 5, wherein the coupling body comprises:
a coupling body that is disposed above the power transmission part so that the substrate seating blade is coupled; and
a coupling body support coupled to a bottom surface of the coupling body by passing through the power transmission part so as to be connected to the first rotation shaft.

7. The substrate processing apparatus of claim 4, wherein the power transmission part comprises:
a main rotation member connected to the substrate rotation power part so as to be rotated;
a first pulley coupled to a lower portion of the rotation plate; and
a power transmission belt wound around the main rotation member and the first pulley to transmit the rotation power of the main rotation member.

8. The substrate processing apparatus of claim 7, wherein the power transmission part further comprises a second pulley which is provided in plurality and on which the power transmission belt is wound together with the main rotation member and the first pulley to convert an installation direction of the power transmission belt.

9. The substrate processing apparatus of claim 7, wherein the power transmission part further comprises at least one first bearing provided between a second rotation shaft, which is installed to pass through the main rotation member, and the main rotation member.

10. The substrate processing apparatus of claim 4, wherein the rotation support comprises an installation space forming part provided in the process chamber to define an installation space in which the power transmission part is installed therein.

11. The substrate processing apparatus of claim 10, wherein the installation space forming part comprises:
a main body which has an internal space and is installed at a center of the bottom surface of the process chamber; and
an extension part provided to radially extend from the main body so as to correspond to a position of the rotation plate.

12. The substrate processing apparatus of claim 11, wherein the rotation support comprises:
a purge gas inflow part provided in the main body to supply a purge gas into the installation space forming part; and
a purge gas outflow part provided in the extension part to pump the supplied purge gas to the outside.

13. The substrate processing apparatus of claim 3, wherein the substrate rotation motor and the substrate transfer rotation motor are vertically disposed in a vertical direction, and the first rotation shaft passes through a through-hole defined in the substrate rotation motor so as to be connected to the transfer support.

14. The substrate processing apparatus of claim 3, wherein the rotation power module further comprises a magnetic fluid chamber provided to surround the second rotation shaft.

15. The substrate processing apparatus of claim 13, wherein the rotation power module further comprises a support assembly provided to support each of the substrate transfer power part and the substrate rotation power part.

16. The substrate processing apparatus of claim 15, further comprising an elevation driving unit configured to vertically move the rotation power module so that the transfer support is moved vertically.

17. The substrate processing apparatus of claim 16, wherein the elevation driving unit comprises:

an elevation power transmission part connected to the support assembly; and an elevation driving source configured to vertically move the support assembly through the elevation power transmission part.

18. The substrate processing apparatus of claim 16, wherein the elevation driving unit further comprises a bellows provided between the support assembly and the process chamber.

\* \* \* \* \*